(12) United States Patent
Ady et al.

(10) Patent No.: US 9,235,299 B2
(45) Date of Patent: Jan. 12, 2016

(54) TOUCH SENSITIVE SURFACE FOR AN ELECTRONIC DEVICE WITH FALSE TOUCH PROTECTION

(71) Applicant: Motorola Mobility LLC, Libertyville, IL (US)

(72) Inventors: Roger W Ady, Chicago, IL (US); Thomas Y Merrell, Beach Park, IL (US); Jiri Slaby, Buffalo Grove, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 300 days.

(21) Appl. No.: 13/760,464

(22) Filed: Feb. 6, 2013

(65) Prior Publication Data

US 2014/0218330 A1    Aug. 7, 2014

(51) Int. Cl.
*G06F 3/044* (2006.01)
*H03K 17/96* (2006.01)

(52) U.S. Cl.
CPC .............. *G06F 3/044* (2013.01); *H03K 17/962* (2013.01); *H03K 2217/96062* (2013.01); *H03K 2217/960705* (2013.01)

(58) Field of Classification Search
CPC ......... G06F 3/044; G06F 3/041; G06F 3/016; G06F 3/03547; G06F 3/0414; G06F 1/169; G06F 1/1626; G06F 3/0416; G06F 3/0488; G06F 2203/0339; G06F 2203/04809; H03K 17/962; H03K 2217/96062; H03K 2217/960705
USPC ............ 345/173–174, 169; 178/18.01, 18.03, 178/18.06; 341/22, 33; 200/600, 43.01
See application file for complete search history.

(56) References Cited

U.S. PATENT DOCUMENTS

| | | | |
|---|---|---|---|
| 6,473,069 B1 * | 10/2002 | Gerpheide | 345/157 |
| 7,710,405 B2 | 5/2010 | Keski-Jaskari | |
| 7,784,366 B2 | 8/2010 | Daverman et al. | |
| 8,191,789 B2 | 6/2012 | Couck | |
| 2003/0235452 A1 * | 12/2003 | Kraus et al. | 400/472 |
| 2004/0080486 A1 * | 4/2004 | Troxell et al. | 345/156 |
| 2006/0214923 A1 * | 9/2006 | Chiu et al. | 345/173 |
| 2007/0291013 A1 * | 12/2007 | Won | 345/173 |
| 2008/0024462 A1 * | 1/2008 | Kim et al. | 345/174 |
| 2008/0204428 A1 * | 8/2008 | Pierce et al. | 345/174 |
| 2008/0246735 A1 * | 10/2008 | Reynolds et al. | 345/173 |
| 2009/0079698 A1 * | 3/2009 | Takashima et al. | 345/169 |
| 2009/0079707 A1 | 3/2009 | Kaehler et al. | |
| 2009/0122017 A1 | 5/2009 | Emig et al. | |
| 2010/0013786 A1 * | 1/2010 | Nishikawa et al. | 345/173 |
| 2010/0128002 A1 * | 5/2010 | Stacy et al. | 345/174 |

(Continued)

OTHER PUBLICATIONS

International Search Report from International Application No. PCT/US2014/012626, mailed Oct. 4, 2014 9 pp.

(Continued)

*Primary Examiner* — Hong Zhou
(74) *Attorney, Agent, or Firm* — Shumaker & Sieffert, P.A.

(57) ABSTRACT

A touch sensitive surface (401) for an electronic device (200) includes a capacitive touchpad (409). A grille (413) of non-conductive material (515) is disposed along at least a portion of the touch sensitive surface. A predefined threshold of a normal force component (804) applied by a user's finger or other conductive object overcomes the grille (413) to allow the finger or other conductive object to interact with the capacitive touchpad. The touch sensitive surface reduces false touch activation occurrences and can simulate the tactility of a mechanical switch.

8 Claims, 9 Drawing Sheets

(56) References Cited

U.S. PATENT DOCUMENTS

| | | |
|---|---|---|
| 2010/0201650 A1 | 8/2010 | Son |
| 2010/0277420 A1 | 11/2010 | Charlier et al. |
| 2010/0315348 A1* | 12/2010 | Jellicoe et al. ............... 345/173 |
| 2011/0227872 A1 | 9/2011 | Huska et al. |
| 2011/0241999 A1* | 10/2011 | Thier ........................... 345/168 |
| 2012/0024132 A1 | 2/2012 | Wallace et al. |
| 2012/0050165 A1* | 3/2012 | Kim et al. .................... 345/168 |
| 2012/0212241 A1 | 8/2012 | Wallace et al. |
| 2012/0212422 A1* | 8/2012 | Fang ............................. 345/173 |
| 2012/0223910 A1* | 9/2012 | McCracken .................. 345/174 |
| 2013/0181935 A1* | 7/2013 | McKenzie et al. ............ 345/174 |
| 2013/0194230 A1* | 8/2013 | Kawaguchi et al. .......... 345/174 |
| 2013/0278562 A1* | 10/2013 | Graumann et al. ........... 345/174 |
| 2014/0225855 A1* | 8/2014 | Aitchison et al. ............. 345/173 |

OTHER PUBLICATIONS

International Preliminary Report on Patentability from International Application No. PCT/US2014/012626, mailed Aug. 20, 2015 8 pp.

* cited by examiner

TOUCH SENSITIVE SURFACE FOR AN ELECTRONIC DEVICE WITH FALSE TOUCH PROTECTION

BACKGROUND

1. Technical Field

This disclosure relates generally to electronic devices, and more particularly to user input elements for electronic devices.

2. Background Art

"Intelligent" portable electronic devices, such as smart phones, tablet computers, and the like, are becoming increasingly powerful computational tools. Moreover, these devices are becoming more prevalent in today's society. For example, not too long ago a mobile telephone was a simplistic device with a twelve-key keypad that only made telephone calls. Today, "smart" phones, tablet computers, personal digital assistants, and other portable electronic devices not only make telephone calls, but also manage address books, maintain calendars, play music and videos, display pictures, and surf the web.

As the capabilities of these electronic devices have progressed, so too have their user interfaces. Prior keypads having a limited number of keys have given way to sophisticated user input devices such as touch sensitive screens or touch sensitive pads. Touch sensitive systems, including touch sensitive displays, touch sensitive pads, and the like, include sensors for detecting the presence of an object such as a finger or stylus. By placing the object on the touch sensitive surface, the user can manipulate and control the electronic device without the need for a physical keypad.

One drawback to touch sensitive electronic devices is that touch sensitive surfaces can be susceptible to "false touch detection," which may occur when a user inadvertently touches the touch sensitive surface with an arm or palm. The processor of the electronic device may interpret this as touch input. Some touch sensitive surfaces will even detect the user's skin through clothing, which can facilitate false touch detection even when the electronic device is stowed in a pocket. It would be advantageous to have an improved touch sensitive surface that is less susceptible to false touch activation.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

A touch sensitive surface with a non-conductive grille is less susceptible to false touch activation. In one embodiment, a grille of non-conductive material is disposed along the touch sensitive surface. One example of a touch sensitive surface is a capacitive touchpad. The grille of non-conductive material can be compressible or non-compressible. The grille can define a parallel pattern of non-conductive grille members, or can define other apertures, which may be linear or non-linear.

The inclusion of the grille atop the touch sensitive surface causes the user to press the area covered by the grille with enough force to either compress the grille (where the grille is manufactured from a compressible material) or cause their finger or stylus to at least partially squeeze between the apertures of the grille (when the grille is manufactured from a non-compressible material). This relatively small extra force provides the necessary field manipulation signal to the capacitive touchpad, and therefore counters any false touch activation that may occur when a finger lightly brushes across a prior art touch sensitive surface. One advantage of implementations of the present disclosure is that they reduce the incidence of false touch activation without requiring any additional electrical hardware or software code. The incorporation of a mechanical grille greatly reduces false touch activation occurrences for a capacitive sensor.

Another advantage of embodiments of the disclosure is that they allow touch sensitive surfaces to be placed about the edges and the back of an electronic device. Prior art electronic devices with touch sensitive surfaces still employ traditional buttons about the edges of the device. Buttons are used because a user frequently grasps the sides of the device when using it. If prior art touch sensitive surfaces were disposed about the edges of the device, those surfaces would be actuated when the user held the device. When implementing embodiments of the disclosure, a non-zero threshold force actuates the touch sensitive surface. Advantageously, they allow touch sensitive controls to be placed on the edges of the device. Those touch sensitive surfaces are not actuated when the user holds the device normally. Instead, they are only actuated when the user applies a force similar to that applied to a conventional popple-type button. Accordingly, embodiments of the present disclosure can be used as volume, selection, scrolling, and other controls on the outer edges of an electronic device.

In one or more embodiments, a grille of non-conductive material can be selectively placed on the touch sensitive surface. This allows a portion of the sensor to act as a conventional touch sensitive surface while other areas act more like conventional buttons in that a distinct normal force actuates portions covered by the grille. Illustrating by example, on a media player a touch sensitive strip can have a slider control formed by a bare capacitive sensor that is bounded by volume controls having grilles of non-conductive material disposed atop the capacitive sensor. The central portion can accept conventional touch gestures, while the volume controls function more like traditional buttons by using the application of additional force for actuation. Such an embodiment allows a user to enjoy all the advantages of a combined button/touch sensitive control device, but without any moving parts to malfunction or mechanical gaps through which water or other debris may enter the housing of the device. In one or more embodiments, haptic feedback, acoustic feedback, and/or visible feedback, e.g., via illumination, can be incorporated into the touch sensitive surface to further simulate a traditional button-type experience but without moving parts.

Figure 18:
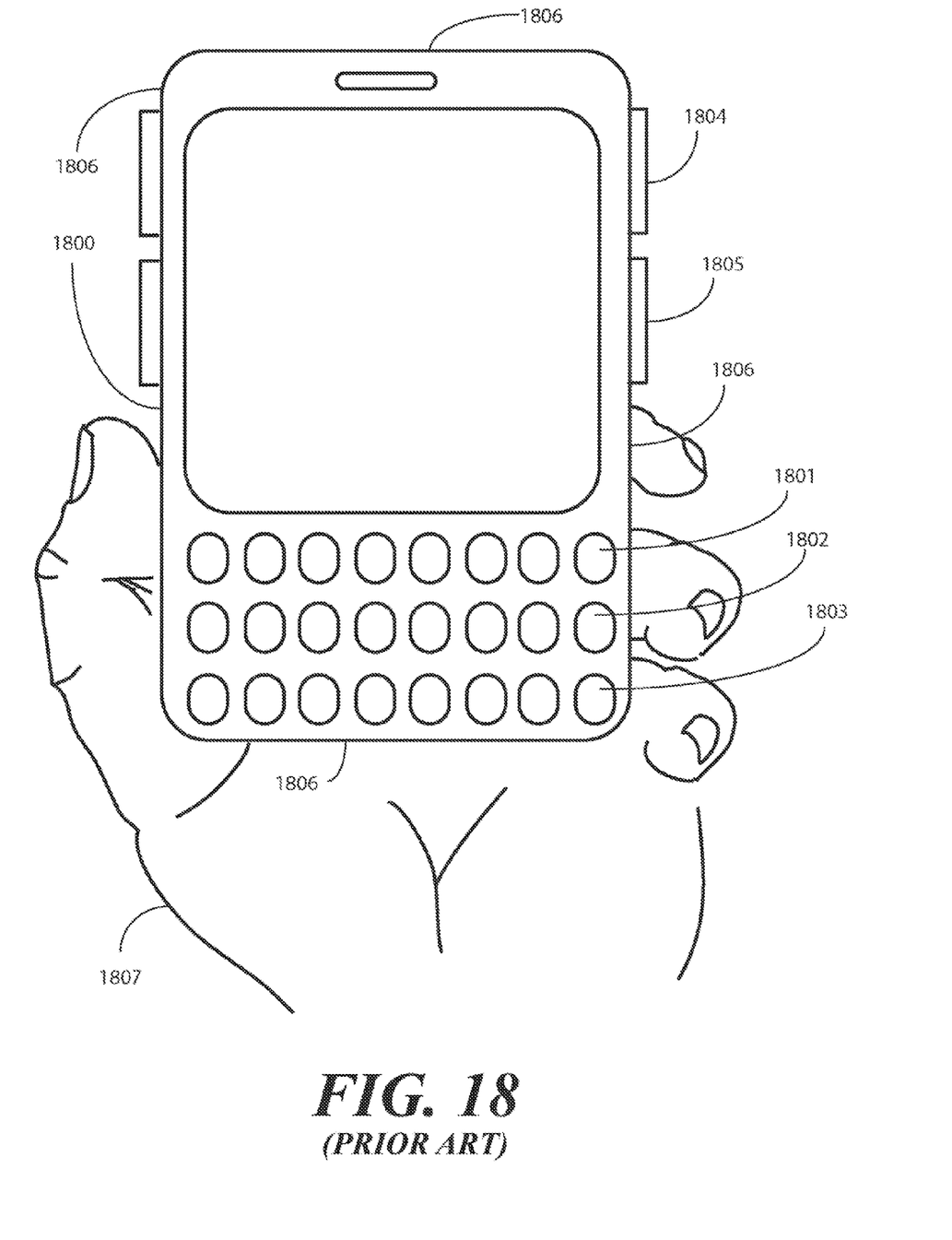
FIG. 18 illustrates a prior art electronic device.

FIG. 18 illustrates a prior art electronic device 1800 having conventional mechanical buttons 1801,1802,1803 along a main face of the user interface and mechanical keys 1804, 1805 on the sides of the device. When a user depresses a mechanical button 1801,1802,1803 or a mechanical key 1804,1805 with a sufficient force, a popple dome or spring member under the pressed surface collapses to connect conductive elements disposed on a printed circuit board, thereby closing a switch.

As noted above, mechanical keys 1804,1805 are frequently used on the perimeter sides 1806 of prior art electronic devices 1800 primarily because a user 1807 often holds the prior art electronic device 1800 by the sides 1806 when in use. Mechanical keys 1804,1805 are designed for a sufficiently high activation force that they can avoid accidental activation when disposed on the sides 1806 of the device. Prior art touch sensitive surfaces are not usually be used on the sides 1806 due to the fact that they do not have this activation force barrier and might therefore be actuated each time the user 1807 holds the device.

Figure 1:
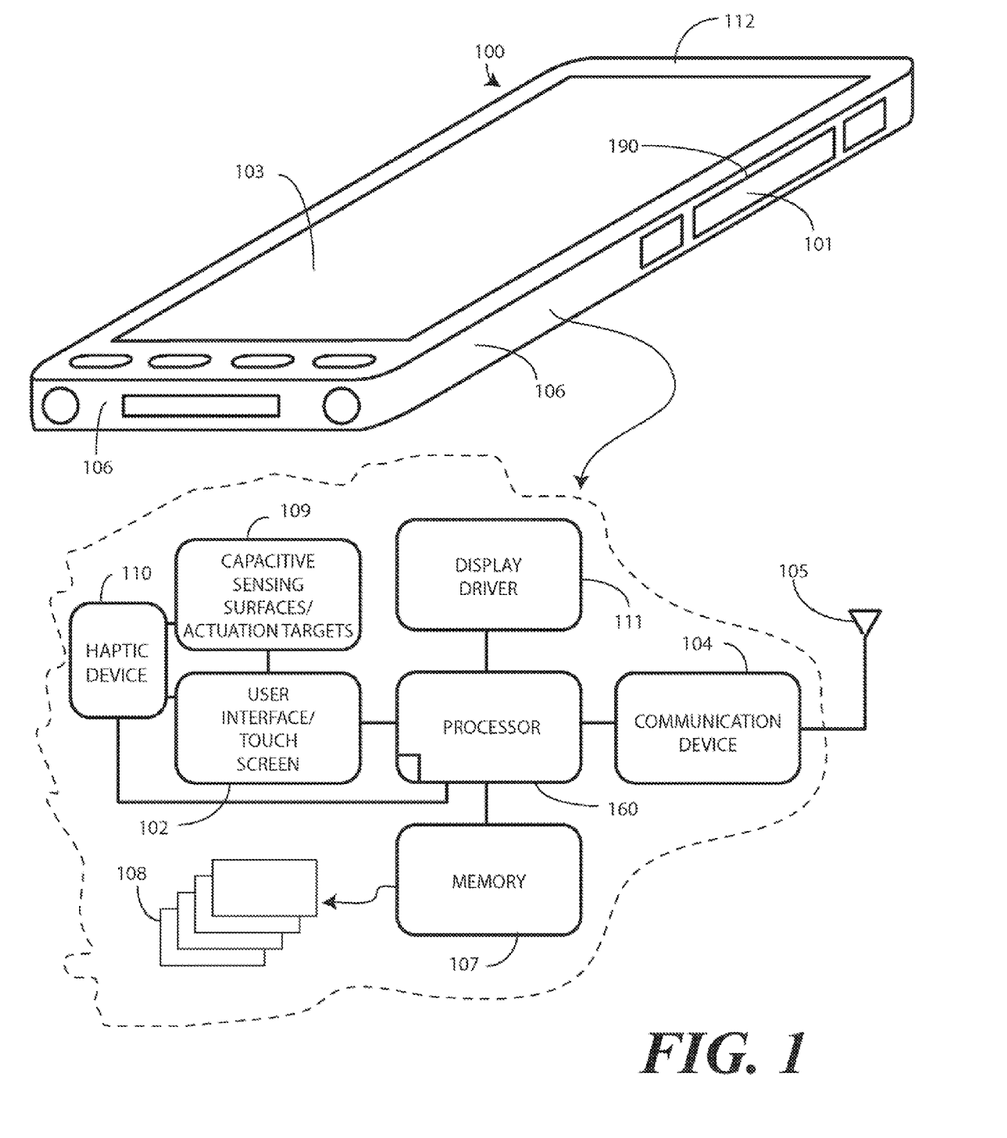
FIG. 1 illustrates an explanatory electronic device configured in accordance with one or more embodiments of the disclosure.
Figure 2:
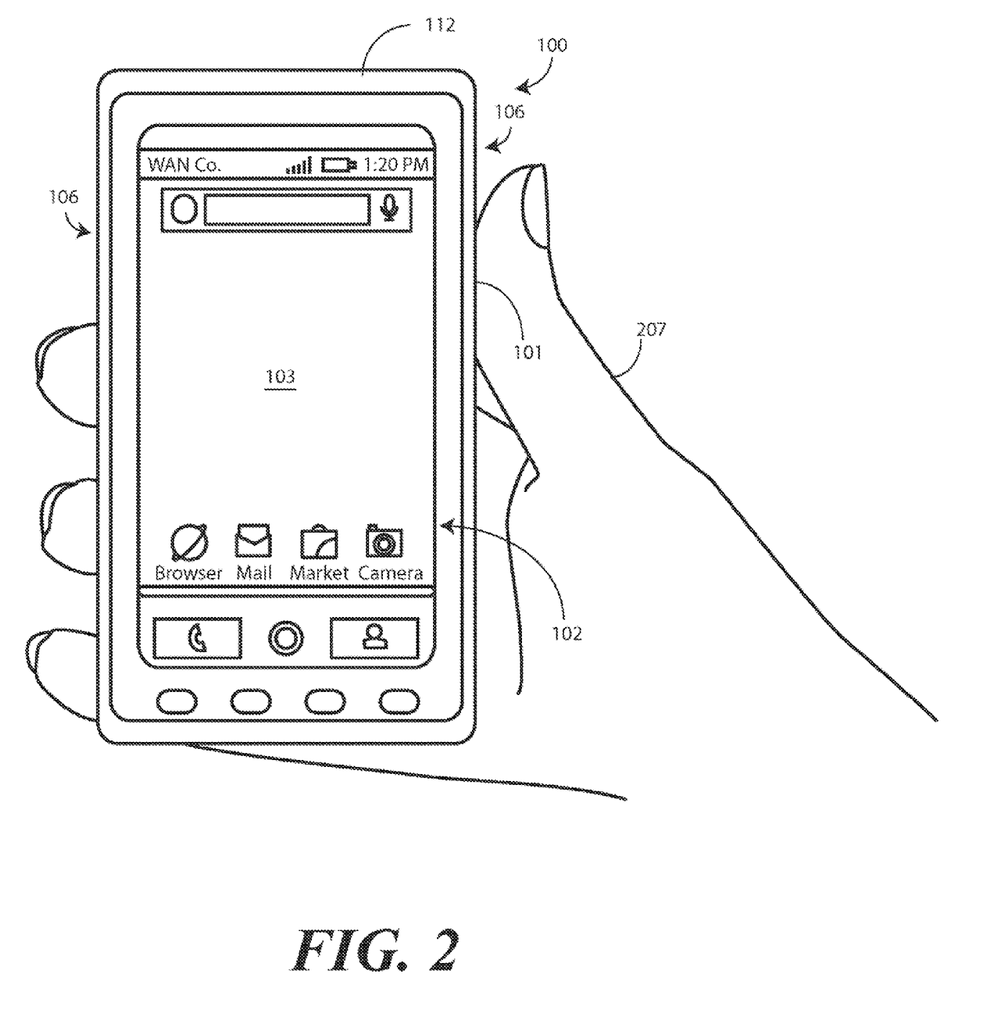
FIG. 2 illustrates another explanatory electronic device configured in accordance with one or more embodiments of the disclosure.

FIGS. 1 and 2 illustrate an electronic device 100 configured in accordance with embodiments of the present disclosure that address the problem described with respect to FIG. 18. The explanatory electronic device 100 is shown as a smart phone for ease of illustration. However, it will be obvious to those of ordinary skill in the art having the benefit of this disclosure that other portable electronic devices may be substituted for the explanatory smart phone of FIGS. 1 and 2. For example, the electronic device 100 may be configured as a palm-top computer, a tablet computer, a gaming device, wearable computer, a remote controller, a media player, laptop computer, portable computer, or other electronic device.

As shown in FIG. 1, the electronic device 100 includes a touch sensitive surface 101. In this explanatory embodiment, the touch sensitive surface 101 is disposed along at least one side 106 of a housing 112 of the electronic device 100. However, as shown in FIG. 2, a user 207 can hold the housing 112 of the electronic device 100 by the sides without inadvertently actuating the touch sensitive surface 101. This is true because the touch sensitive surface 101, in one embodiment, includes capacitive touchpad 109 and a grille (not visible in FIG. 2) of non-conductive material disposed along a portion of a face of the capacitive touchpad 109. Explanatory configurations will be explained in more detail with reference to FIGS. 3-6 and 9-14 below. It should be noted that while the touch sensitive surface 101 of FIG. 2 is illustratively disposed on one perimeter side 106 of the housing 112 of the electronic device 100 to illustrate one of its advantages, such touch sensitive surfaces configured in accordance with embodiments of the disclosure can be disposed on any external surface of the electronic device.

In FIG. 1, the explanatory electronic device 100 is shown illustratively with a schematic block diagram. The illustrative electronic device 100 includes a user interface 102 with a touch-sensitive display 103. In FIG. 1, the user interface 102 includes a touch sensitive surface 101 that is operable with a display driver 111. The illustrative electronic device 100 also includes a communication circuit 104 that can be configured for wired or wireless communication with one or more other devices or networks. The networks can include a wide area network, a local area network, or personal area network as well. The communication circuit 104 can include wireless communication circuitry, one of a receiver, a transmitter, or transceiver, and one or more antennas 105.

The electronic device 100 includes a control circuit 160, which can have one or more processors. The control circuit 160 is responsible for performing the various functions of the device. In one embodiment, the control circuit 160 is operable with the capacitive touchpad 109 to detect touch actuation from an object overcoming a force threshold defined by the grille to actuate the capacitive touchpad 109. The control circuit 160 can be a microprocessor, a group of processing components, one or more Application Specific Integrated Circuits (ASICs), programmable logic, or other type of processing device. The control circuit 160 can be operable with the user interface 102 and the communication circuit 104, as well as various peripheral ports (not shown) that can be coupled to peripheral hardware devices via interface connections.

The control circuit 160 can be configured to process and execute executable software code to perform the various functions of the electronic device 100. A storage device, such as memory 107, stores the executable software code used by the control circuit 160 for device operation. The executable software code used by the control circuit 160 can be configured as one or more modules 108 that are operable with the control circuit 160. Such modules 108 can store instructions, control algorithms, and so forth. The instructions can instruct processors or control circuit 160 to perform the various steps, touch sensing, and methods described below.

In one embodiment, the touch sensitive surface 101 includes a capacitive touchpad 109. The capacitive touchpad 109 can be configured to detect movement of, for example, a user's finger, within a region defined by, for example, the outer perimeter 190 the capacitive touchpad 109. The capacitive touchpad 109 can further be configured to detect a direction of the movement within the region. Capacitive touchpads suitable for use with embodiments of the disclosure can be constructed in a variety of ways. For example, in one embodiment the capacitive touchpad 109 is formed by horizontal conductors and vertical conductors that cross over each other to define a grid. The conductors can be coupled to a touch driver, operable with the control circuit 160, that delivers a signal to the grid. Electrical charges then travel through the grid, which defines a coordinate plane. Electromagnetic fields are then created about the capacitive touchpad 109. The fields are altered by interaction of a user's finger or other conductive object along the capacitive touchpad 109. Other forms of capacitive touchpads suitable for use with embodiments of the disclosure will be obvious to those of ordinary skill in the art having the benefit of this disclosure.

In one or more embodiments, the touch sensitive surface 101 is operable with an optional haptic component 110. The haptic component 110 can be configured to provide a pseudo-tactile feedback in response to user actuation sensed at the touch sensitive surface 101. The haptic component 110 can accordingly simulate the popples or spring mechanisms of conventional keys by delivering a tactile response to the touch sensitive surface 101 when actuated by a user 207.

In one embodiment of a haptic component 110, a haptic layer includes a transducer configured to provide a sensory feedback when a user actuates a virtual key. In one embodiment, the transducer is a piezoelectric transducer configured to apply a mechanical "pop" to the body of the device that is strong enough to be detected by the user. Thus, the tactile feedback layer of a haptic component 110 provides sensory feedback to the user, thereby making the substantially planar touch sensitive surface 101 react similar to a conventional keypad. As an alternative to including a haptic device, acoustic feedback could be provided via speakers. Visible feedback could also be provided either directly from the touch-sensitive display 103, or by integrating light emitting diodes, optionally with light guides, along surfaces of the electronic device 100. In another embodiment, electrostatic vibration technology may also be used on the surface top to provide haptic feedback in response to user gestures, such as swiping.

Figure 3:
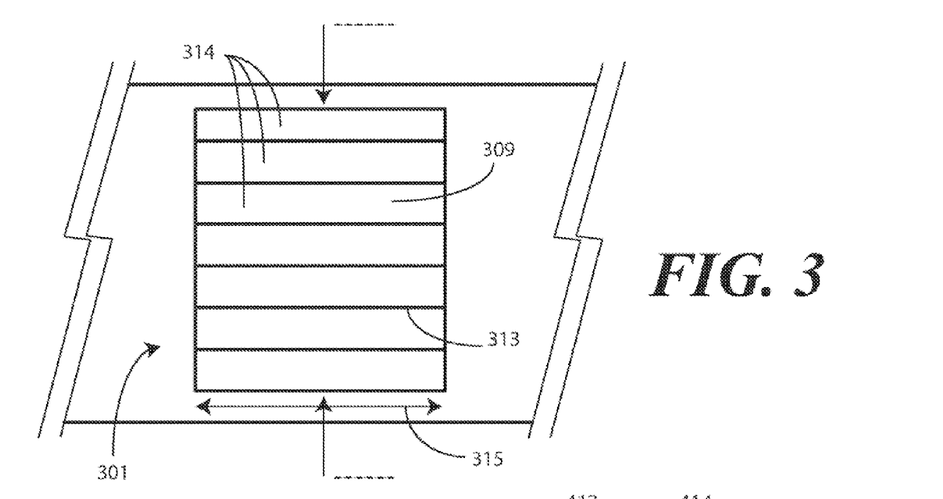
FIG. 3 illustrates one explanatory touch sensitive surface configured in accordance with one or more embodiments of the disclosure.

FIG. 3 illustrates one embodiment of a touch sensitive surface 301 configured in accordance with one or more embodiments of the disclosure. The touch sensitive surface 301 includes a capacitive touchpad 309 and a grille 313 disposed along an external surface of the capacitive touchpad 309. In one embodiment, the grille 313 is manufactured from a non-conductive material, i.e., a material that does not conduct electromagnetic signals. Examples of non-conductive materials include plastic, polymers, and rubber, although others will be obvious to those of ordinary skill in the art having the benefit of this disclosure. In one embodiment, the grille 313 is manufactured from a compressible material. In another embodiment, the grille 313 is manufactured from a non-compressible material.

In the illustrative embodiment of FIG. 3, the grille 313 defines a parallel pattern 314 of non-conductive members, each spanning the width 315 of the capacitive touchpad 309. It will be clear to those of ordinary skill in the art having the benefit of this disclosure that other configurations of non-conductive elements could be used as well. Some may not need a grille at all. For example, in one embodiment the non-conductive members are configured as a simple compressible layer. In such an embodiment, when the layer is compressed a touch interaction will be detected. However, when uncompressed, the touch interaction will not be detected. Moreover, as will be shown in FIG. 15-17, other grille geometries, including those that have non-linear apertures, can be employed as well. Returning to FIG. 3, the grille 313 can define a grating of horizontal or parallel apertures through which the capacitive touchpad 309 is exposed.

The grille 313 selectively covers the capacitive touchpad 309 with a non-conductive material, which means that the capacitive touchpad 309 detects a user's finger or other conductive object during application of a threshold amount of normal force (into the page). In one embodiment, the size of the grille 313 is configured to correspond to an average fingerprint surface area so as to further prevent false actuation from objects that are larger than an ordinary finger. Because a non-zero threshold normal force component actuates the capacitive touchpad 309 through the grille 313, the grille 313 reduces "falsing" or false activations of the touch sensitive surface 301. The use of the touch sensitive surface 301 advantageously can replace a conventional key or button to make an electronic device more dust resistant, water resistant, or more reliable. The touch sensitive surface 301 of FIG. 3 can further be turned ON or OFF electronically. Moreover, the field strength of the capacitive touchpad 309 can be tuned or optimized to allow a different touch experience for the user. For example, the capacitive touchpad sensitivity can be increased to actuate with a lighter normal-direction touch, and correspondingly can be decreased when more normal-direction force is desired to actuate a particular sensor.

Figure 4:
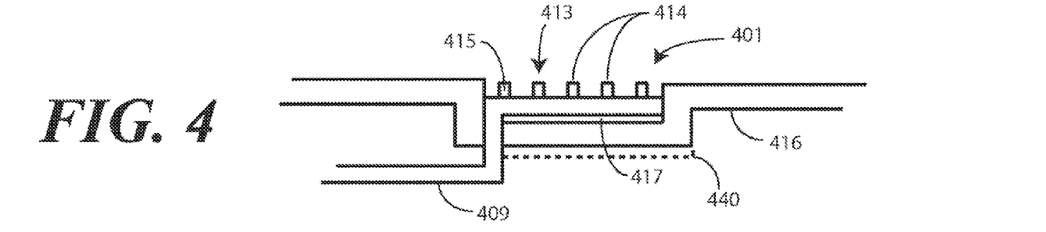
FIG. 4 illustrates a side elevation view of one explanatory touch sensitive surface configured in accordance with one or more embodiments of the disclosure.
Figure 5:
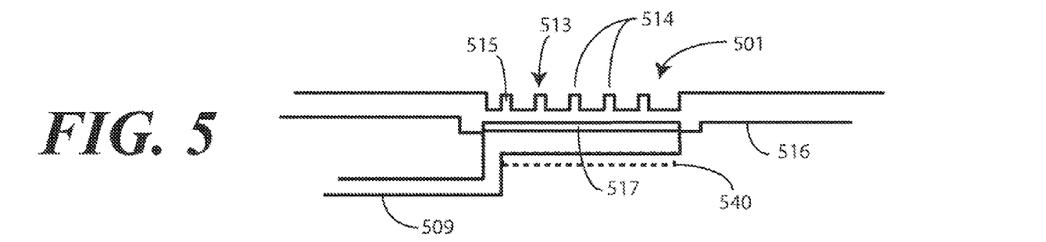
FIG. 5 illustrates a side elevation view of another explanatory touch sensitive surface configured in accordance with one or more embodiments of the disclosure.
Figure 6:
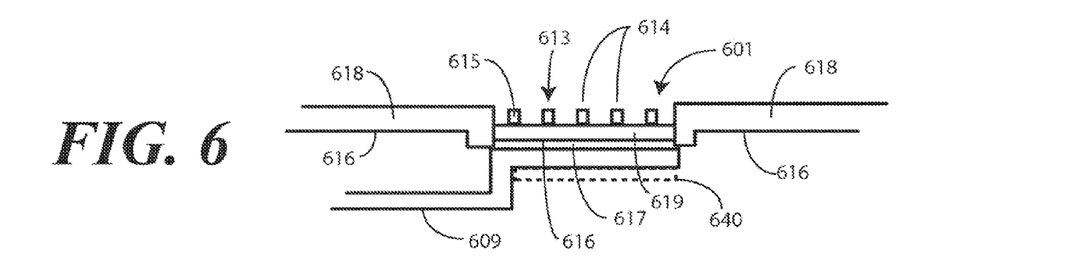
FIG. 6 illustrates a side elevation view of yet another explanatory touch sensitive surface configured in accordance with one or more embodiments of the disclosure.

FIGS. 4-6 illustrate different ways that the touch sensitive surfaces configured in accordance with embodiments of the disclosure can be constructed. Each figure shows a side elevation view of a different embodiment of a touch sensitive surface configured in accordance with one or more embodiments of the disclosure. Each embodiment may offer an advantage for a particular application. Illustrating by example, the embodiment of FIG. 4 may require less power in the capacitive sensor due to the fact that the capacitive sensor is disposed closer to the user's finger at actuation. The embodiment of FIG. 5 may result in a lower cost assembly due to fact that the assembly is simpler to manufacture. The embodiment of FIG. 6 can result in a lower assembly cost and lower power consumption as conductive material connects to the capacitive sensor at a location closer to the user's finger at actuation.

Beginning with FIG. 4, the touch sensitive surface 401 includes a parallel pattern 414 of non-conductive material 415 disposed atop a capacitive touchpad 409. The grille 413 formed by the non-conductive material 415 defines air gaps between each non-conductive element. In one embodiment, the non-conductive material 415 can be adhesively attached to the capacitive touchpad 409, although other attachment methods will be obvious to those of ordinary skill of the art having the benefit of this disclosure. In one embodiment, the non-conductive material 415 is at least partially made from a compressible material. In another embodiment, the non-conductive material 415 is at least partially made from a non-compressible material.

In the illustrative embodiment of FIG. 4, a housing substrate 416 is attached to the capacitive touchpad 409. The housing substrate 416 of this illustrative embodiment is a rigid layer formed of metal, plastic, or another housing material. In one embodiment, the housing substrate 416 is also manufactured from a non-conductive material. An adhesive layer 417 is disposed between an inner surface of the capacitive touchpad 409 and the housing substrate 416 to bond the two together.

In one embodiment, an optional haptic layer 440 is configured to provide a sensory feedback when a user actuates a virtual key. In one embodiment, the optional haptic layer 440 includes a piezoelectric transducer configured to apply a mechanical "pop" to the body of the device that is strong enough to be detected by the user. Thus, the optional haptic layer 440 provides sensory feedback to the user, thereby making the substantially planar touch sensitive surface 401 react similar to a conventional keypad.

In FIG. 5, the touch sensitive surface 501 again includes a parallel pattern 514 of non-conductive material 515 disposed atop a housing substrate 516. The housing substrate 516 of this illustrative embodiment is a rigid layer, although it could be flexible in other embodiments. In one embodiment, the housing substrate 516 is also manufactured from a non-conductive material.

An adhesive layer 517 is then disposed between the housing substrate 516 and a capacitive touchpad 509. The adhesive layer 517 bonds the capacitive touchpad 509 to the housing substrate 516. As shown, the capacitive touchpad 509 is disposed on a side of the housing substrate 516 opposite the touch sensitive surface 501 defined by the ribs of non-conductive material 515.

The grille 513 formed by the non-conductive material 515 defines air gaps between each non-conductive element above the housing substrate 516. In one embodiment, the non-conductive material 515 can be an integral component of the housing substrate 516. For example, they may be molded together as a single part. In other embodiments, the non-conductive material defining the grille 513 can be adhesively, thermally, or otherwise attached to the housing substrate 516. In this illustrative embodiment, the non-conductive material 515 defining the grille 513 is a non-compressible material.

In one embodiment, an optional haptic layer 540 is configured to provide a sensory feedback when a user actuates a virtual key. In one embodiment, the optional haptic layer 540 includes a piezoelectric transducer configured to apply a mechanical "pop" to the body of the device that is strong enough to be detected by the user. Thus, the optional haptic layer 540 provides sensory feedback to the user, thereby making the substantially planar touch sensitive surface 501 react similar to a conventional keypad.

In FIG. 6 the touch sensitive surface 601 includes a parallel pattern 614 of non-conductive material 615 disposed atop a housing substrate 616. The housing substrate 616 of FIG. 6 includes both a non-conductive portion 618 and a conductive portion 619. The non-conductive portion 618 is disposed on either side of the touch sensitive surface 601, while the conductive portion 619 is disposed along the width and length of the touch sensitive surface 601 beneath the non-conductive material 615. Examples of a non-conductive material suitable for forming the non-conductive portion 618 would be ABS plastic, polycarbonate, or ABS-polycarbonate, and other resins. Examples of a conductive material suitable for forming the conductive portion 619 would be metal, metallized plastic, or carbon impregnated plastic. The illustrative housing substrate 616 of this illustrative embodiment is a rigid layer, although it could be flexible in other embodiments.

An adhesive layer 617 is then disposed between the conductive portion 619 of the housing substrate 616 and a capacitive touchpad 609. The adhesive layer 617 bonds the capacitive touchpad 609 to the conductive portion 619 of the housing substrate 616.

As with previous embodiments, the grille 613 formed by the non-conductive material 615 defines air gaps between each non-conductive element above the conductive portion 619 of the housing substrate 616. In one embodiment, non-conductive material 615 defining the grille 613 can be adhesively attached to the conductive portion 619 of the housing substrate 616. In this illustrative embodiment, the non-conductive material 615 defining the grille 613 is a compressible material. The choice of whether to employ a compressible or non-compressible non-conductive material will depend upon the application for which the user input is intended. Using compressible material provides certain advantages, such as requiring lower power in the capacitive touchpad 609 due to the fact that the capacitive touchpad 609 can be arranged so as to be closer to the user's finger when actuated.

In one embodiment, an optional haptic layer 640 is configured to provide a sensory feedback when a user actuates a virtual key. In one embodiment, the optional haptic layer 640 includes a piezoelectric transducer configured to apply a mechanical "pop" to the body of the device that is strong enough to be detected by the user. Thus, the optional haptic layer 640 provides sensory feedback to the user, thereby making the substantially planar touch sensitive surface 601 react similar to a conventional keypad.

Figure 7:
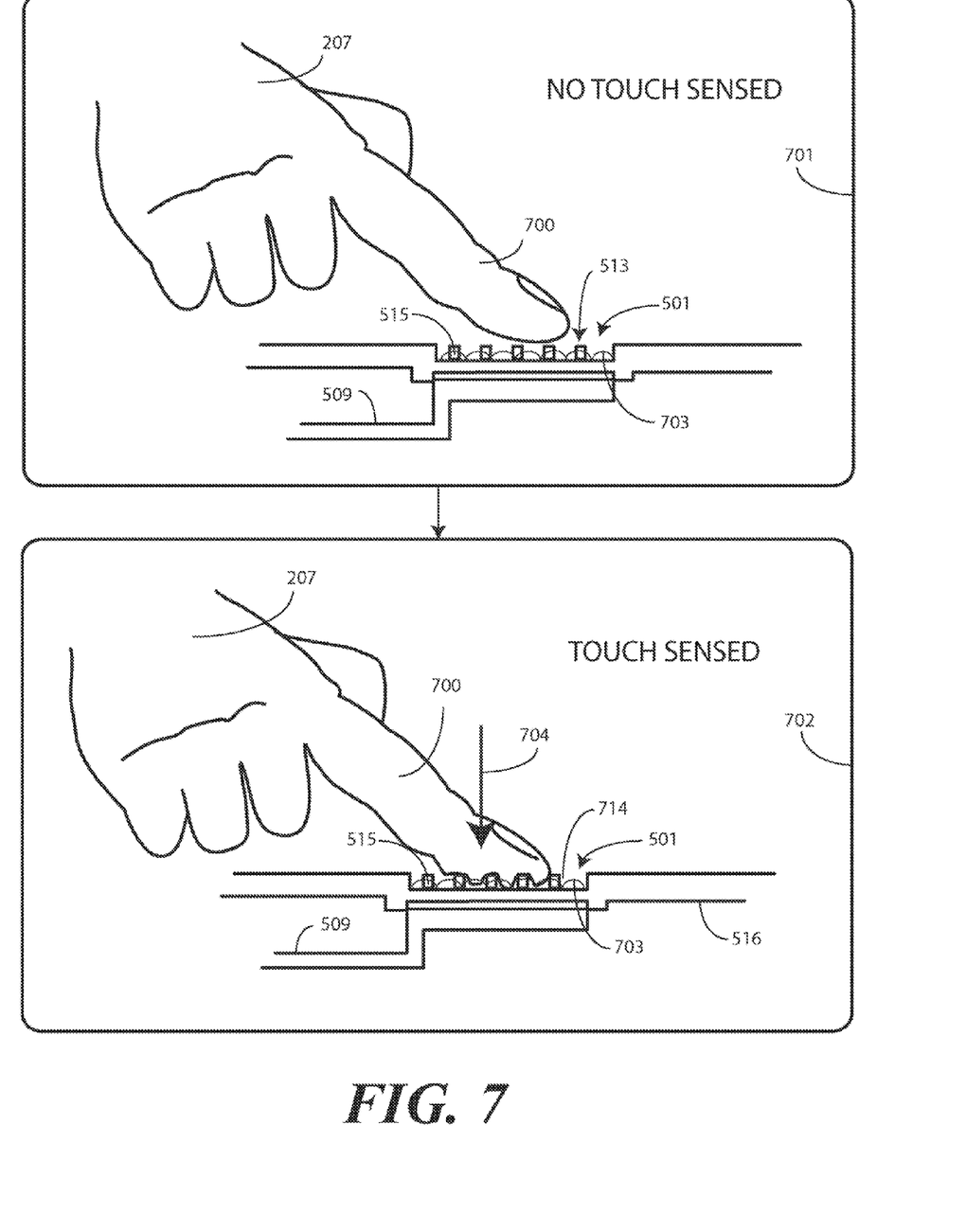
FIG. 7 illustrates a method of using an explanatory touch sensitive surface configured in accordance with one or more embodiments of the disclosure.

FIG. 7 illustrates a user 207 actuating a touch sensitive surface 501 in an implementation where the non-conductive material 515 defining the grille 513 is made from a non-compressible material. As shown at scenario 701, when the user 207 places a finger 700 atop the touch sensitive surface 501, the grille 513 prevents the user's finger 700 from sufficiently altering the electromagnetic field 703 created by the capacitive touchpad 509. Accordingly, a control circuit (160) operable with the capacitive touchpad 509 would not detect touch activation.

However, as shown in scenario 702, when the user applies a force component 704 normal to the touch sensitive surface 501 sufficient to press portions of the finger 700 into the air gaps 714 defined between the ribs of non-conductive material 515, those portions of the finger 700 are sufficiently close to the capacitive touchpad 509 as to interfere with the electromagnetic field 703. Accordingly, a control circuit (160) operable with the capacitive touchpad 509 detects a touch activation.

In one embodiment, the height to which the ribs of non-conductive material 515 extend above the housing substrate 516 in this embodiment (or, for example, the capacitive touchpad (409) of the embodiment of FIG. 4), is configured such that the force component 704 must be greater than at least a predetermined threshold for a control circuit (160) to detect a touch activation. This height will, of course, depend upon the configuration of the electromagnetic field 703 and other factors. In one embodiment, the height is configured such that the predetermined threshold is greater than about 350 grams of force so as to simulate the tactility of a mechanical switch, such as an ordinary membrane tactile key present on prior art electronic devices. In one embodiment, the predetermined threshold is between 200 and 350 grams. Some "rugged" embodiments may employ higher thresholds of force, such as one pound.

Figure 8:
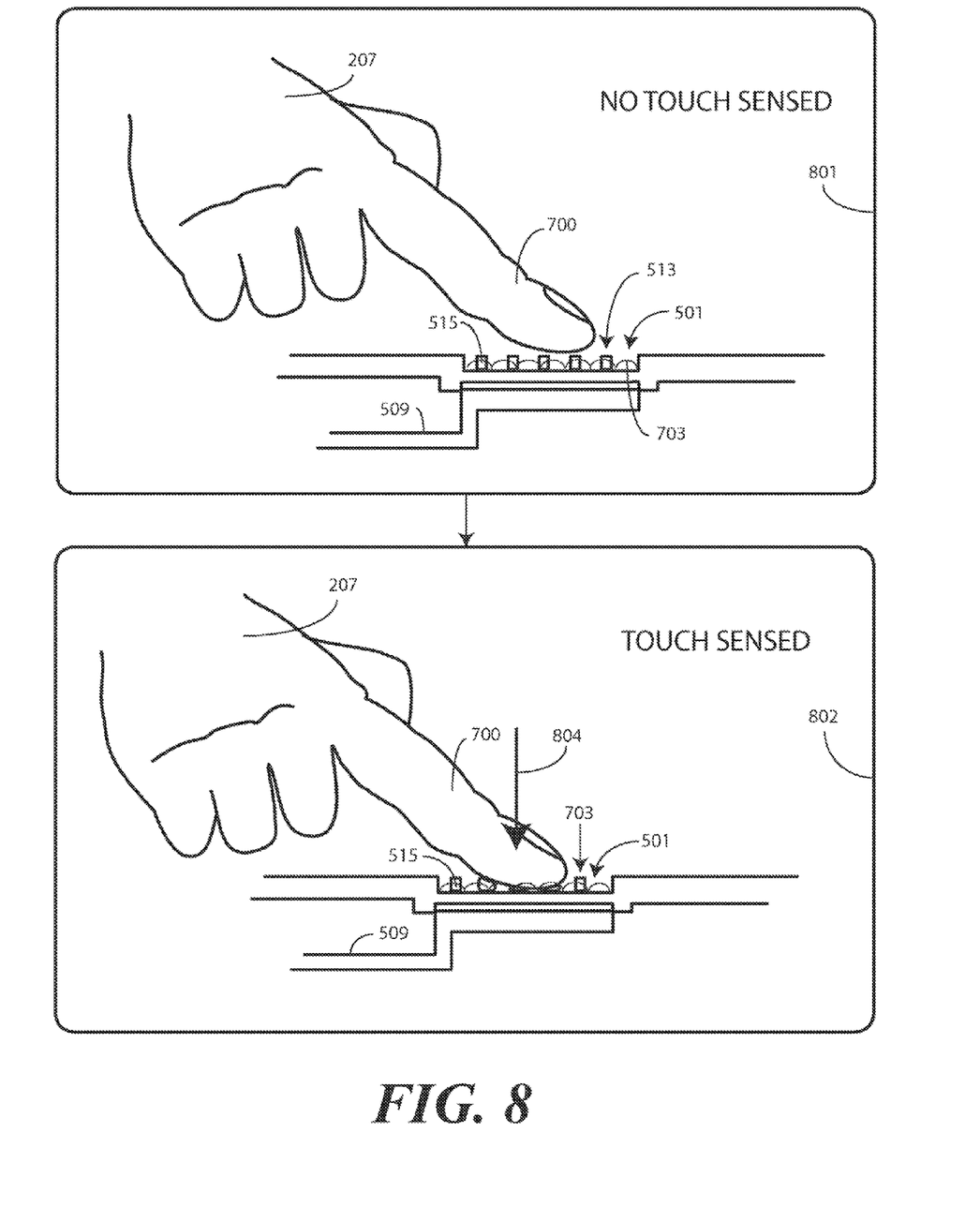
FIG. 8 illustrates a method of using another explanatory touch sensitive surface configured in accordance with one or more embodiments of the disclosure.

FIG. 8 illustrates a user 207 actuating a touch sensitive surface 501 in an implementation where the non-conductive material 515 defining the grille 513 includes a compressible material. As shown in scenario 801, when the user 207 places a finger 700 atop the touch sensitive surface 501, the grille 513 prevents the user's finger 700 from sufficiently altering the electromagnetic field 703 created by the capacitive touchpad 509. Accordingly, a control circuit (160) operable with the capacitive touchpad 509 would not detect touch activation.

However, as shown in scenario 802, when the user applies a force component 804 normal to the touch sensitive surface 501 sufficient to compress the non-conductive material 515, the finger 800 interferes with the electromagnetic field 703. Accordingly, a control circuit (160) operable with the capacitive touchpad 509 detects a touch activation.

In one embodiment, the compression coefficient of the ribs of non-conductive material 515 is configured such that the force component 804 must be greater than at least a predetermined threshold for the control circuit (160) to detect a touch activation. This compression coefficient will depend upon the configuration of the electromagnetic field 703 and other factors. In one embodiment, the compression coefficient is configured such that the predetermined threshold is greater than about 1 pound of force so as to simulate an ordinary membrane tactile key present on prior art electronic devices.

Figure 9:
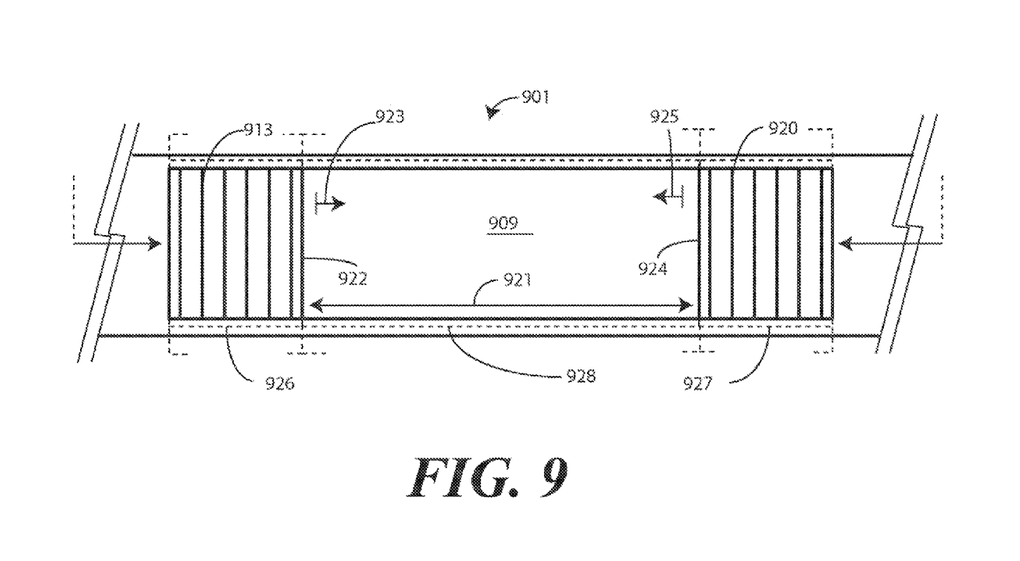
FIG. 9 illustrates yet another explanatory touch sensitive surface configured in accordance with one or more embodiments of the disclosure.

FIG. 9 illustrates an alternate touch sensitive surface 901 configured in accordance to one or more embodiments of the disclosure. In FIG. 9, the touch sensitive surface 901 includes a first grille 913 of non-conductive material disposed along the touch sensitive surface 901 and a second grille 920 of non-conductive material disposed along the touch sensitive surface 901. The first grille 913 and the second grille 920 are separated distally by a length 921 along the touch sensitive surface 901. Note that the capacitive touchpad 909 disposed along the length 921 can include a series of capacitive touch segments that are actuated sequentially when a user swipes a finger across the segments. Accordingly, a control circuit (160) operable with the capacitive touchpad 909 can detect gesture input. Where the touch sensitive surface 901 is defined by a capacitive touchpad 909, the capacitive touchpad 909 extends beyond a boundary 922 of the first grille 913 in at least one dimension 923. Similarly, the capacitive touchpad 909 extends beyond a boundary 924 of the second grille 920 in at least one dimension 925.

Figure 10:
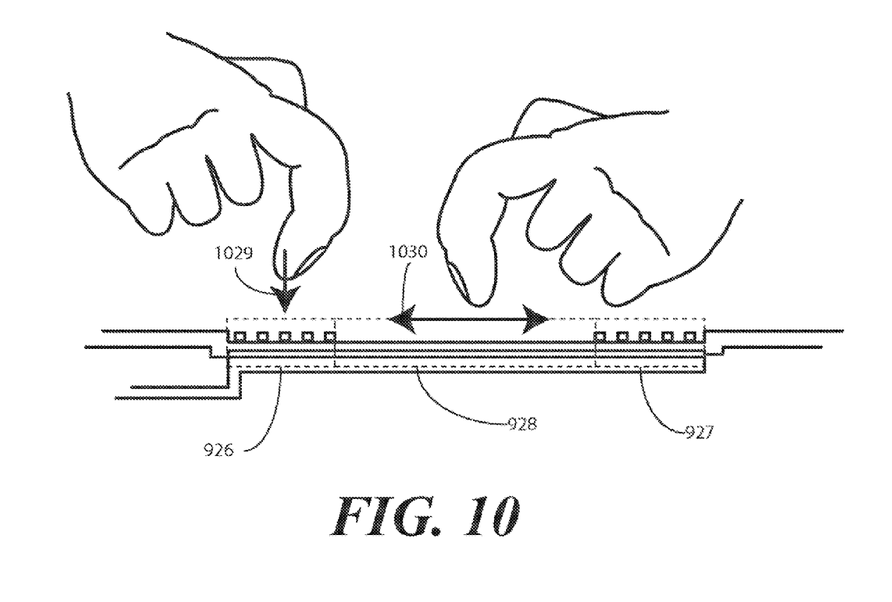
FIG. 10 illustrates a method of using another explanatory touch sensitive surface configured in accordance with one or more embodiments of the disclosure.

In the configuration of FIG. 9, each grille 913,920 defines a region 926,927 of the touch sensitive surface where a user must apply a sufficient force component for a control circuit (160) operable with the capacitive touchpad 909 to detect a touch activation. Accordingly, each region 926,927 can operably function as a simulated key. By contrast, the region 928 disposed between the first grille 913 and the second grille 920 can be used as a conventional touch pad. Accordingly, the control circuit (160) operable with the capacitive touchpad 909 can detect gesture input in this region 928 and touch input in the regions 926,927 defined by the grilles 913,920. The embodiment of FIG. 9 is therefore useful as, for example, a control for a media player in that a user can perform scrolling operations 1030 in region 928 and selection operations 1029 in regions 926,927 as shown in FIG. 10. In other applications, touch input in the regions 926,927 may correspond to a trigger, such as an unlocking input for the device, so as to minimize false touch activation for input gestures that may be more system-critical, leaving less system-critical inputs to be applied in region 928.

Figure 12:
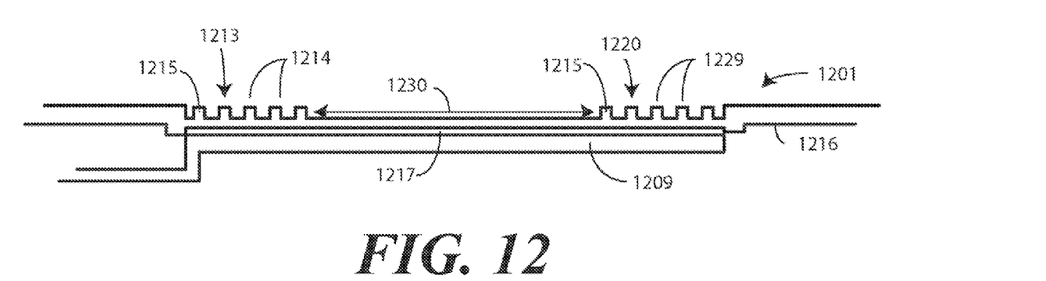
FIG. 12 illustrates a side elevation view of yet another explanatory touch sensitive surface configured in accordance with one or more embodiments of the disclosure.
Figure 13:
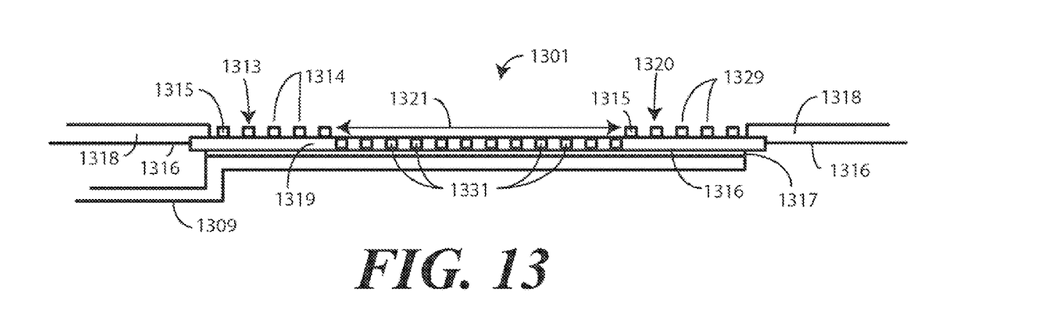
FIG. 13 illustrates a side elevation view of yet another explanatory touch sensitive surface configured in accordance with one or more embodiments of the disclosure.
Figure 14:
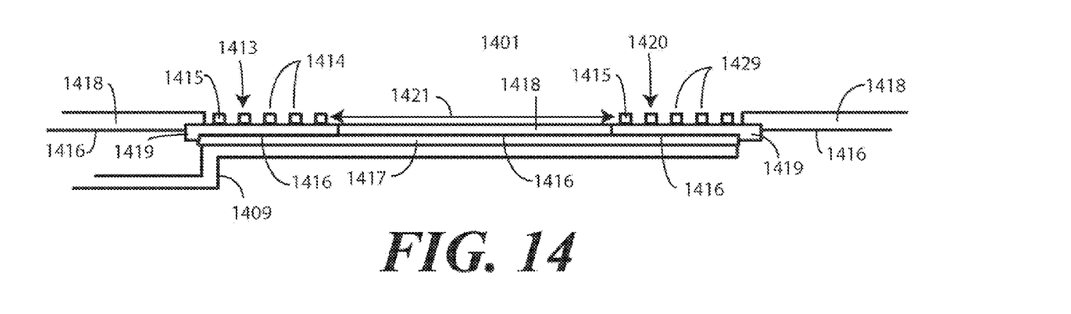
FIG. 14 illustrates a side elevation view of yet another explanatory touch sensitive surface configured in accordance with one or more embodiments of the disclosure.

FIGS. 11-14 illustrate different implementations of touch sensitive surfaces constructed in accordance with embodiments of the disclosure. Each figure shows a side elevation view of a different embodiment of a touch sensitive surface configured in accordance with one or more embodiments of the disclosure. Each embodiment may offer an advantage for a particular application. Illustrating by example, the embodiment of FIG. 11 may require less power in the capacitive sensor due to the fact that the capacitive sensor is disposed closer to the user's finger at actuation. The embodiment of FIG. 12 may result in a lower cost assembly due to fact that the assembly is simpler to manufacture. The embodiment of FIG. 13 can result in a lower assembly cost and lower power consumption as conductive material connects to the capacitive sensor at a location closer to the user's finger at actuation. FIG. 14 offers a low housing cost, ease of assembly, and reduced power in the mid-regions of the device.

Figure 11:
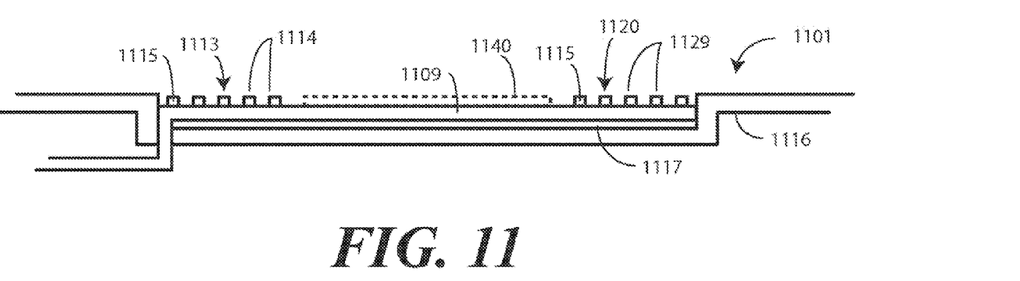
FIG. 11 illustrates a side elevation view of another explanatory touch sensitive surface configured in accordance with one or more embodiments of the disclosure.

Beginning with FIG. 11, the touch sensitive surface 1101 includes first pattern 1114 of non-conductive material 1115 defining a first grille 1113 and a second pattern 1129 of non-conductive material 1115 defining a second grille 1120. Each of the first grille 1113 and the second grille 1120 is disposed atop a capacitive touchpad 1109. The first grille 1113 and the second grille 1120 formed by the non-conductive material 1115 define air gaps between each non-conductive element. In one embodiment, the non-conductive material 1115 can be adhesively bonded to the capacitive touchpad 1109, although other attachment methods will be obvious to those of ordinary skill of the art having the benefit of this disclosure. In one embodiment, the non-conductive material 1115 includes a compressible material. In another embodiment, the non-conductive material 1115 includes a non-compressible material.

In the illustrative embodiment of FIG. 11, a housing substrate 1116 is attached to the capacitive touchpad 1109. The housing substrate 1116 of this illustrative embodiment is a rigid layer formed of metal, plastic, or another housing material. In one embodiment, the housing substrate 1116 is also manufactured from a non-conductive material. An adhesive layer 1117 is disposed between the capacitive touchpad 1109 and the housing substrate 1116 to bond the two together.

In each of FIGS. 11-14, an optional haptic layer can be disposed beneath the assembly as was described in FIGS. 4-6 above. The haptic layer, where used, is configured to provide a sensory feedback when a user actuates a virtual key. In one embodiment, the optional haptic layer includes a piezoelectric transducer configured to apply a mechanical "pop" to the body of the device that is strong enough to be detected by the user. Thus, the optional haptic layer provides sensory feedback to the user, thereby making the substantially planar touch sensitive surface react similar to a conventional keypad.

As an alternative to the haptic layer, electrostatic technology can be used to provide sensory feedback as well. For example, in FIG. 11 an electrostatic vibration element 1140 is disposed atop the capacitive touchpad 1109 and is configured to vibrate in response to user input. One example of an electrostatic vibration element 1140 is manufactured by Senseg Corporation of Taipei, Taiwan. In one embodiment, the electrostatic vibration element 1140 is actuated by the capacitive touchpad 909 (which can be formed by segments of touch sensitive pads) detects a gesture input, such as a swiping motion.

In FIG. 12, the touch sensitive surface 1201 again includes first pattern 1214 of non-conductive material 1215 defining a first grille 1213 and a second pattern 1229 of non-conductive material 1215 defining a second grille 1220. The first grille 1213 and the second grille 1220 are separated by a separation region 1230. The housing substrate 1216 of this illustrative embodiment is a rigid layer, although it could be flexible in other embodiments. In one embodiment, the housing substrate 1216 is also manufactured from a non-conductive material.

An adhesive layer 1217 is then disposed between the housing substrate 1216 and a capacitive touchpad 1209. The adhesive layer 1217 attaches the capacitive touchpad 1209 to the housing substrate 1216. As shown, the capacitive touchpad 1209 is disposed on a side of the housing substrate 1216 opposite the touch sensitive surface 1201.

In one embodiment, the non-conductive material 1215 can be an integral component of the housing substrate 1216. For example, they may be molded together as a single part. In other embodiments, the non-conductive material 1215 can be adhesively, thermally, or otherwise attached to the housing substrate 1216. In this illustrative embodiment, the non-conductive material 1215 defining the grille 1213 is a non-compressible material.

In FIG. 13 the touch sensitive surface 1301 includes a first pattern 1314 of non-conductive material 1315 defining a first grille 1313 and a second pattern 1329 of non-conductive material 1315 defining a second grille 1320. The housing substrate 1316 of FIG. 13 includes both a non-conductive portion 1318 and a conductive portion 1319. The non-conductive portion 1318 is disposed on either side of the touch sensitive surface 1301, while the conductive portion 1319 is disposed along the width and length of the touch sensitive surface 1301 both beneath the non-conductive material 1315 and beneath the separation region 1321 between the two grilles 1313, 1320. In this illustrative embodiment, the conductive portion 1319 disposed beneath the separation region 1321 has one or more non-conductive elements 1331 integrated into the conductive material forming the conductive portion 1319 of the touch sensitive surface 1301. These non-conductive elements 1331 are aligned with non-conductive segments of the capacitive touchpad 1309. While optional, the one or more non-conductive elements 1331 integrated into the conductive material allow a control circuit (160) operable with the capacitive touchpad 1309 to detect the location of a user's finger or other object on the surface of the separation region 1321.

An adhesive layer 1317 is then disposed between the conductive portion 1319 of the housing substrate 1316 and a capacitive touchpad 1309. The adhesive layer 1317 bonds the capacitive touchpad 1309 to the conductive portion 1319 of the housing substrate 1316. In one embodiment, non-conductive material 1315 can be adhesively attached to the conductive portion 1319 of the housing substrate 1316. In this illustrative embodiment, the non-conductive material 1315 defining the grille 1313 is a compressible material.

In FIG. 14 the touch sensitive surface 1401 includes a first pattern 1414 of non-conductive material 1415 defining a first grille 1413 and a second pattern 1429 of non-conductive material 1415 defining a second grille 1420. The housing substrate 1416 of FIG. 14 includes a non-conductive portion 1418 and a conductive portion 1419. The non-conductive portion 1418 of FIG. 14 is disposed outside the perimeter of the touch sensitive surface 1401. The non-conductive portion 1418 is also disposed between the first grille 1413 and the second grille 1420 in the separation region 1421. This results in the conductive portion 1419 being disposed in areas of the touch sensitive surface 1401 outside the separation region 1421. In this case, touchpad sensitivity is optimized for detection through the housing.

An adhesive layer 1417 is then disposed between the housing substrate 1416 and a capacitive touchpad 1409 spanning the touch sensitive surface 1401. The adhesive layer 1417 bonds the capacitive touchpad 1409 to the housing substrate 1416. In one embodiment, non-conductive material 1415 can be adhesively attached to the conductive portion 1419 of the housing substrate 1416. In this illustrative embodiment, the non-conductive material 1415 defining the grille 1413 is a compressible material.

Figure 15:
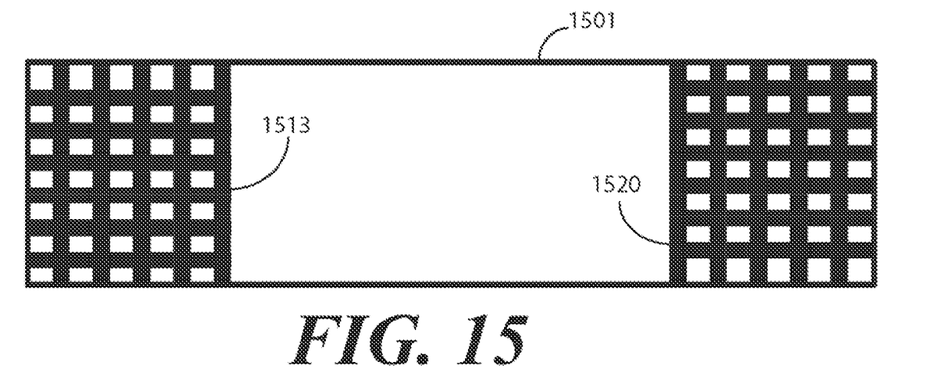
FIGS. 15-17 illustrate explanatory configurations of grilles for touch sensitive surfaces configured in accordance with one or more embodiments of the disclosure.
Figure 16:
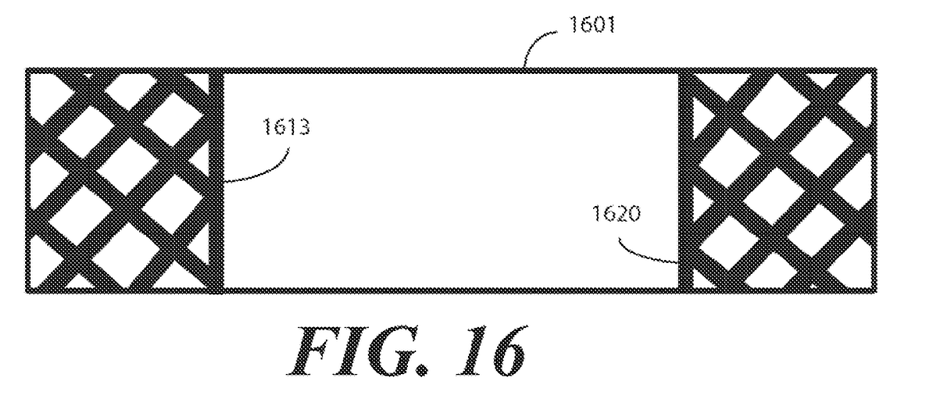
Figure 17:
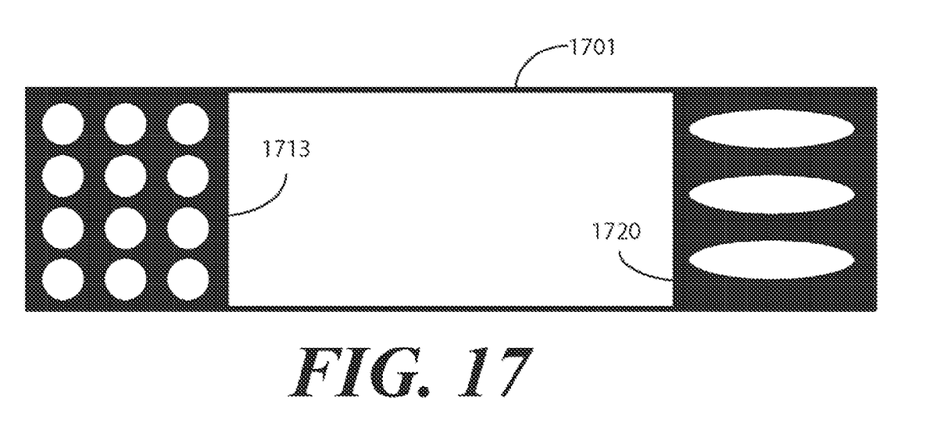

Many of the above embodiments have employed parallel patterns of non-conductive materials for ease of description. However, as noted, it will be obvious to those of ordinary skill in the art having the benefit of this disclosure that embodiments of the disclosure are not so limited. The grilles of embodiments of the disclosure can be constructed in any number of geometries. FIGS. 15-17 illustrate just a few of the myriad of geometries that are possible without departing from the spirit and scope of the disclosure. Note that while FIGS. 15-17 show touch sensitive surfaces having two grilles, the explanatory geometries could be applied to touch sensitive surfaces having one, three, four, or more grilles as well. Additionally, while the grilles of the explanatory embodiments of FIGS. 15-16 are illustrated with matching left and right sides, geometrically mismatched grilles such as that shown in FIG. 17 can be used as well.

Beginning with FIG. 15, this touch sensitive surface 1501 has a first grille 1513 and a second grille 1520 that are configured as gratings with perpendicular intersections and rectilinear apertures. FIG. 16 illustrates a touch sensitive surface 1601 having a first grille 1613 and a second grille 1620 configured as lattices with rhomboid apertures. FIG. 17 illustrates a touch sensitive surface 1701 having a first grille 1713 and a second grille 1720 having non-linear apertures such as circles and ovals. Other non-linear apertures are available such as hexagons (a honeycomb pattern), pentagons, octagons, paisley patterns, fan-shapes (for circular patterns), keyhole shapes, X-shapes, W-shapes, and combinations.

As described above, embodiments of the disclosure surround or selectively cover a capacitive touchpad with a non-conductive material so that the underlying capacitive touchpad is activated through application of a non-zero threshold amount of normal force. In one of the simplest embodiments, a parallel pattern of ribs is raised along a portion of the touch sensor such that a finger cannot sufficiently interact with the capacitive sensor unless a threshold amount force is applied to extend a portion of the finger down into air gaps (or alternatively to compress the non-conductive material of the grille). Embodiments of the invention can be configured with very thin form factors, and can configured to simulate the tactility of mechanical switches, thereby allowing touch sensitive controls to be placed on edges or other surfaces of an electronic device in place of mechanical buttons and keys. Advantageously, this facilitates a dust-resistant and/or water-resistant device housing that will not suffer from mechanical switch failures.

It should be observed that the embodiments reside primarily in combinations of method steps and apparatus components related to providing a touch sensitive surface for an electronic device. Any process descriptions or blocks in flow charts should be understood as representing modules, segments, or portions of code that include one or more executable instructions for implementing specific logical functions or steps in the process. Alternate implementations are included, and it will be clear that functions may be executed out of order from that shown or discussed, including concurrently or in reverse order, depending on the functionality involved. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

It will be appreciated that embodiments of the invention described herein may be comprised of one or more conventional processors and unique stored program instructions that control the one or more processors to implement, in conjunction with certain non-processor circuits, some, most, or all of the functions of detecting touch activation with a capacitive touchpad or other touch sensor as described herein. The non-processor circuits may include, but are not limited to, a radio receiver, a radio transmitter, signal drivers, clock circuits, power source circuits, and user input devices. As such, these functions may be interpreted as steps of a method to perform touch sensing or touch activation operations. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Embodiments of the invention have been described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. Also, reference designators shown herein in parenthesis indicate components shown in a figure other than the one in discussion. For example, talking about a device (10) while discussing figure A would refer to an element, 10, shown in figure other than figure A.

In the foregoing specification, specific embodiments of the present invention have been described. However, one of ordinary skill in the art appreciates that various modifications and changes can be made without departing from the scope of the present invention as set forth in the claims below. Thus, while preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

What is claimed is:

1. An electronic device, comprising:
    a housing substrate that forms at least one side of the electronic device, the housing substrate comprising a non-conductive portion and a conductive portion; and
    a touch sensitive surface disposed along the conductive portion of the housing substrate, wherein the non-conductive portion of the housing substrate is disposed on either side of the touch sensitive surface, the touch sensitive surface comprising:
        a capacitive touchpad spanning the touch sensitive surface;
        an adhesive layer bonding the capacitive touchpad to a first side of the housing substrate; and
        a grille of non-conductive material disposed along at least a portion of the capacitive touchpad, wherein the grille is adhesively attached to the conductive portion of the housing substrate on a side of the housing opposite the touch sensitive surface.

2. The electronic device of claim 1, further comprising:
    a control circuit, operable with the capacitive touchpad, to detect touch actuation from an object overcoming a force threshold defined by the grille.

3. The electronic device of claim 2, further comprising:
    a haptic component operable with the control circuit, the control circuit to actuate the haptic component upon detecting the touch actuation.

4. The electronic device of claim 1, wherein the grille is disposed along a first portion of the capacitive touchpad and not along a second portion of the capacitive touchpad, the second portion being sufficiently sized to allow a user to perform a gesture input at the second portion without touching the first portion.

5. The electronic device of claim 4, wherein the grille is a first grille and the touch sensitive surface further comprises a second grille of the non-conductive material disposed along a third portion of the capacitive touchpad, wherein the second portion of the capacitive touchpad separates the first portion and the third portion.

6. The electronic device of claim 5, wherein the electronic device is configured to perform a scrolling operation in response to the gesture input at the second portion.

7. The electronic device of claim 5, wherein the electronic device is configured to increase a volume level in response to detecting a gesture at a first portion and decrease the volume level in response to detecting a gesture at the third portion.

8. The electronic device of claim 1, wherein the housing comprises a non-conductive portion outside a perimeter of the touch sensitive surface.

* * * * *